Sept. 2, 1969 R. DENNING ET AL 3,465,209
SEMICONDUCTOR DEVICES AND METHODS OF MANUFACTURE THEREOF
Filed July 7, 1966
FIG. 1. PRIOR ART
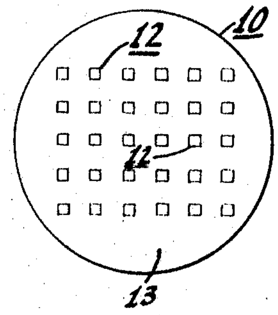
PRIOR ART
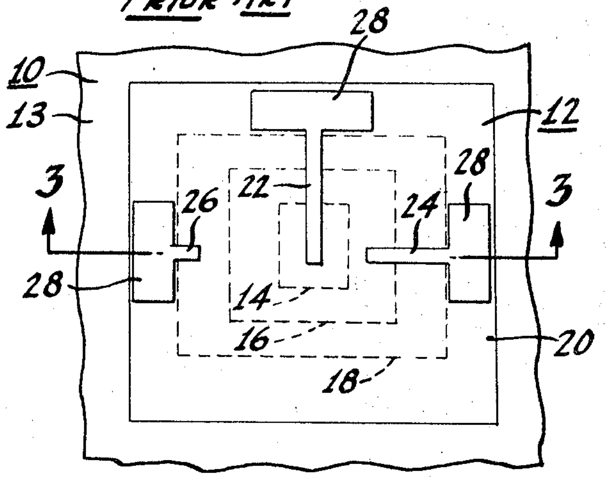
FIG. 2.
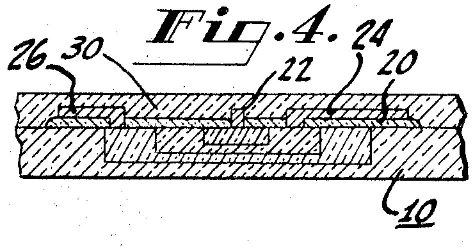
PRIOR ART
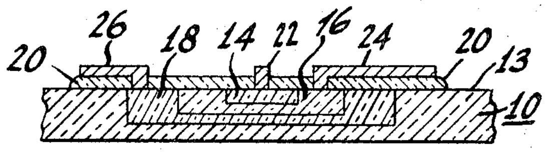
FIG. 3.
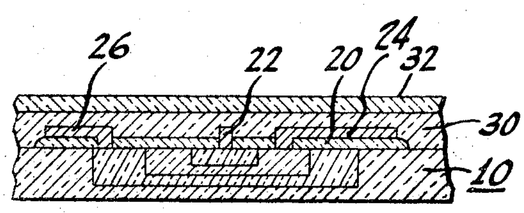
FIG. 5.
INVENTORS
RICHARD DENNING &
CHARLES L. TOLLIN
BY M. Y. Epstein
Attorney

United States Patent Office 3,465,209
Patented Sept. 2, 1969

3,465,209

SEMICONDUCTOR DEVICES AND METHODS OF MANUFACTURE THEREOF

Richard Denning and Charles L. Tollin, Union, N.J., assignors to RCA Corporation, a corporation of Delaware Filed July 7, 1966, Ser. No. 563,505
Int. Cl. H01l 3/00, 5/00, 11/00
U.S. Cl. 317—234 13 Claims

ABSTRACT OF THE DISCLOSURE

Semiconductor wafers are quite susceptible to injury. In many present-day devices, for example surface patterns of extremely narrow and closely spaced metal connector strips are used which are readily damaged by the slightest touching or scratching of the wafer surface. Further, during processing of the wafers, undesired contaminants from the processing apparatus or ambient atmosphere often settle upon the wafer and react with the materials thereof. Such contaminant are found to effect the electrical characteristics of the devices during the operating life thereof. Removal of these contaminants has heretofore been a difficult task, the attempted solutions of which have been generally unsuccessful. It has been discovered that by providing a protective coating extending over the wafer surface and metal contacts, which is capable of passivating contaminating impurities, the problem is resolved.

This invention relates to semiconductor devices, e.g., transistors, and particularly to improved devices and methods for improving the quality of such devices, and for increasing the manufacturing yield thereof.

According to one process of fabricating semiconductor devices, a wafer of a semiconductor material, such as silicon, is provided with a pattern or regions of different type conductivity within the body of the wafer and at a surface thereof. Various ones of the different regions are interconnected by means of surface strips of a conducting material, such as aluminum. Enlarged areas of the conducting material on the surface of the wafer serve as bonding pads to which connecting or terminal wires of the device are bonded. In the usual instance, a plurality of individual device patterns, e.g., transistor patterns, are formed in rows and columns on the wafer, and the wafer is then broken-up, as by scribing, into individual transistor semiconductor pellets.

The semiconductor wafers are quite susceptible to injury. In many present-day devices, for example, surface patterns of extremely narrow and closely spaced metal connector strips are used which are readily damaged by the slightest touching or scratching of the wafer surface. Further, during processing of the wafers, undesired contaminants from the processing apparatus or ambient atmosphere often settle upon the wafer and react with the materials thereof. Such contaminants are found to affect the electrical charcteristics of the devices in a random manner and cause instability of the electrical characteristics of the devices during the operating life thereof. Removal of these contaminants has heretofore been a difficult task, the attempted solutions of which have been generally unsuccessful. Additionally, silicon is a hard and brittle material, and chipping of the individual pellets frequently occurs during the wafer scribing operation. The chipped pellets are generally not useable and must be discarded.

Objects of this invention are to provide novel and improved methods of fabricating semiconductor devices, and to provide semiconductor devices of improved quality.

Further objects of this invention are to provide improved methods for increasing the manufacturing yield of semiconductor devices, and for improving the operating stability of such devices.

For achieving these objects, completed wafers having different type conductivity regions and surface patterns of conductive material connectors are provided in known manner. The completed wafers are then provided with a coating of a protective, insulating encapsulating material which has an impurity gettering or passivating characteristic, which is impervious to ambient impurities, and, preferably, which is readily penetrable by known bonding means, such as ultrasonic wire-bonding tools.

In a preferred embodiment, the protective coating comprises a first layer of phosphorous-doped silicon dioxide, and a second coating of undoped silicon dioxide. Preferably, the two layers are provided by a vapor deposition process.

In the drawings:

FIG. 1 is a plan view of a prior art semiconductor wafer;

FIG. 2 is an enlarged plan view of a portion of FIG. 1;

FIG. 3 is a section along line 3—3 of FIG. 2;

FIG. 4 is a section of the device of FIG. 3 according to one embodiment of the invention; and FIG. 5 is a sectional view similar to FIG. 4 but showing a modification thereof.

With reference to FIG. 1, an example of a known type of semiconductor wafer 10 is shown. The wafer 10 is a disc of a semiconductor material, such as silicon, having rows and columns of spaced device patterns 12 at one surface 13 thereof. One pattern 12 is shown in FIGS. 2 and 3 and comprises a region 14 of P type conductivity within a region 16 of N type conductivity within a region 18 of P type conductivity. Overlying the surface 13 of the wafer 10 is an insulating layer 20 of silicon dioxide. Overlying the insulating layer 20 are a number of strips 22, 24, and 26 of electrically conducting material such as aluminum, copper, gold, chromium, silver, or the like. Each of the strips 22, 24, and 26 extends through a respective opening in the insulating layer 20 into electrical engagement with a respective one of the regions 14, 16, and 18. Each strip 22, 24, and 26 terminates in an enlarged area 28 of the conducting material. The enlarged areas 28 serve as bonding pads to which connector wires are to be bonded.

The preparation of the wafer 10 including the regions 14, 16, and 18, the insulating layer 20, and the conducting strips 22, 24, and 26, as well as other semiconductor wafers of different materials and of different configurations, are well known, hence are not described herein.

For improving the yield of unchipped and useable pellets from the wafer 10, for protecting the pullets during subsequent processing steps, and for improving the stability of devices fabricated from the pellets (or from an entire wafer, if such be desired), the entire surface 13 of the wafer 10 and the materials thereon are encapsulated in a protective coating 30, as shown in FIG. 4. The protective coating has the following characteristics: it is of an insulating material so as not to electrically short the various contacts on the surface of the wafer; it is sufficiently thick and tough to protect the contacts against physical damage; it has an impurity passivating or gettering characteristic to neutralize impurities on the wafer surface; it is impervious to ambient contaminants; and it is readily penetratable by known bonding means, such as ultrasonic bonding tools.

In one embodiment, as shown in FIG. 4, the wafer 10 is provided with a single protective coating 30 of phosphorous doped silicon dioxide. The phosphorous constituent of the layer 30 is between 0.1% and 5%, by weight, and the layer 30 is between 1,000 Angstoms and 5,000 Angstoms thick. Neither the percentage of phosphorous nor the thickness of the layer 30 is critical. Over the bonding pads 28, however, thicknesses in excess of 10,000 Angstroms are not generally desirable, since such thicknesses may interfere with the subsequent connector bonding operations.

The layer 30 is preferably provided by known vapor deposition processes, that is, either by decomposition of a compound or by evaporation, to provide a coating having the desired physical characteristics. For example, a mixture of silane ($SiH_4$) and phosgene (($H_3P$) vapors may be cracked by heating in oxygen, in the presence of the wafer 10, whereby a phosphorous doped layer of silicon dioxide is deposited on the wafer. Other means for vapor depositing doped silicon dioxide coatings are described, for example, in U.S. Patent 3,200,019, issued to Scott, Jr., and Olmstead on Aug. 10, 1965, for Method for Making A Semiconductor Device.

The coated wafer is next heated to a temperature between 400 and 600° C. for a time sufficient to 'activate" the phosphorous. Such heating may, e.g., be in the order of a few minutes. The resulting coating 30 comprises a somewhat loosely matted matrix of small crystals completely encapsulating the surface 13 of the wafer 10 and filling in the spaces between the conductive strips 22, 24, and 26. In comparison with known "thermally grown" layers of silicon dioxide, that is, layers provided, for example, by oxidizing a portion of the silicon substrate, the layer 30 is not sintered or densified, is relatively soft, and is thus readily penetrable by known scribing and bonding tools. The layer 30 is sufficiently thick and dense, however, to protect the wafer surface against physical injury and to be impervious to ambient contaminants.

Although not fully understood, the phosphorous in the layer 30, when activated, appears to act as a getter and removes or "passivates" certain impurities on the underlying surface of the wafer. The impurities are believed to be electrical charge carriers such as ions of sodium, calcium, barium, or the like, present in minute quantities in the insulating layer 20 of the wafer 10, or on the surface of other types of semiconductor material wafers. The phosphorous, it is believed, "associates" or reacts with the impurities in such manner as to immobilize them and prevent movement thereof, as leakage currents, across the semiconductor junctions. In any event, it is found that the presence of the phosphorous results in devices having greater stability during their operating life than was heretofore obtainable.

Other "gettering" or "passivating" materials, such as copper, nickel, titanium, molybdenum, tungsten, uranium, aluminum, arsenic, germanium, or the like, are known. These materials can be used as substitutes for, or in addition to, the phosphorous in the silicon dioxide coating 30. These materials can be provided by known means including, for example, cracking a vapor of the material. For example, a vapor of aluminum chloride can be cracked simultaneously with the cracking of the silane to produce a coating 30 of aluminum doped silicon dioxide.

In another embodiment, a second layer 32 (FIG. 5) of undoped silicon dioxide is provided covering the first layer 30. The second layer 32 can be provided, for example, by cracking silane vapor. Phosphorous, it is found, has some tendency to absorb water vapor from the ambient atmosphere, and an advantage of using a second layer 32 of undoped silicon dioxide is that the second layer is moisture proof. The two layers 30 and 32, having a combined thickness of between 1,000–5,000 Angstroms, thus comprise an hermetic seal for the wafer surface.

In another embodiment, the wafer surface is encapsulated in a single coating 30 of phosphorous doped silicon nitride. The silicon nitride coating is preferably also provided by a vapor deposition process to provide a coating having the desired physical characteristics. For example, ammonia ($NH_3$) is caused to react with silane $SiH_4$) according to the following reaction:

$$NH_3 + SiH_4 \xrightarrow{700^\circ\ C.} Si_3N_4 + 12H_2$$

The silicon nitride vapor is cooled to a temperature low enough to avoid damage to the wafer, e.g., around 400° C. The cooled vapor is mixed with phosgene vapor, and the vapor mixture is passed into a heated chamber containing the wafer. Oxygen is admitted into the chamber to cause cracking of the phosgene, whereupon phosphorous doped silicon nitride is deposited onto the wafer. The coated wafer is then heated to a temperature of around 400–600° C. for a time sufficient to activate the phosphorous. Such heating may, e.g., be in the order of a few minutes. The phosphorous content of the layer 30 is not critical, and, e.g., can be between 0.1% and 5%, by weight, of the layer.

Silicon nitride vapor can also be provided by known reactive sputtering processes, using a silicon anode in a partial atmosphere of nitrogen.

In another embodiment, a second layer 32 of undoped silicon nitride is coated over a first coating 30 of phosphorous doped silicon nitride to hermetically encapsulate the phosphorous doped layer. In the second coating process, the phosgene is omitted from the silicon nitride vapor.

A coating of silicon nitride is somewhat denser and harder than a coating of silicon dioxide, hence silicon nitride coatings having a thickness between 500 and 1,000 Angstroms are preferred. Although the thickness of the silicon nitride coatings are not critical, combined coating thicknesses over the bonding pads in excess of 5,000 Angstroms, for example, may interfere with the subsequent connector bonding operations.

The encapsulated wafer 10 is then scribed in usual fashion, such as with a diamond scribing needle. The vapor deposited silicon dioxide and silicon nitride coatings are relatively soft as compared with the silicon substrate and thermally grown silicon dixoide layers, and the dicing needle readily penetrates these coatings without causing chipping thereof. The presence of the encapsulating coating, it is found, prevents chipping of the underlying silicon wafer material.

The individual pellets are then mounted in semiconductor device enclosurers in usual fashion, and connectors, such as fine wires or the like, are bonded to the bonding pads 28 on the pellets. Although the bonding pads 28 are covered by the protective coatings, it is found that the usual type of bonding means, and especially known types of wire feeding ultrasonic bonding needles, can readily penetrate the protective coatings (if not too thick or dense, as heretofore noted) for directly engaging and bonding the connector wires to the bonding pads. Selective removal of portion of the protective coating above the bonding pads is thus not required. Other connector bonding means, such as thermocompression bonder, welders, or the like, can be used. A known type of thermocompression or ultrasonic bonding tool is described, for example, in U.S. Patent 3,128,648, for Apparatus for Joining Metal Leads to Semiconductive Devices, issued to R. P. Clagett on Apr. 14, 1964.

Having described certain specific embodiments of protective coatings, and methods of applying the coatings, other suitable coating materials and methods of application thereof will be apparent to those skilled in the art. Examples of such materials are various glasses, certain carbides such as silicon carbide, and titanium carbide, certain nitrides such as germanium nitride and silicon oxynitride, certain oxides such as magnesium oxide, magnesium hydroxide, and silicon monoxide, and magnesuim fluoride, or the like. These materials can be doped with suitable gettering or passivating materials and can be coated onto semiconductor wafers in such manner and with such thickness and density, depending upon the particular material used and the means for applying the material, to physically and chemicaly protect the wafers, while being readily penetrable by bonding means such as known ultrasonic bonding tools. In general, the denser the material, the thinner should the protective layer be. Also, the protective material layer should preferably not be sintered, but should preferably comprise a somewhat loose matrix of particles.

What is claimed is:

1. A semiconductor device comprising a pellet of semiconductor material, a region of said pellet being doped and extending to a surface of said pellet, an insulating coating covering said surface, a metal contact on said coating, a portion of said contact extending through said coating and into electrical contact with said region, and an encapsulating coating covering said insulating coating and said metal contact thereon, said encapsulating coating comprising a substance capable of passivating contaminating impurities.

2. A semiconductor device as in claim 1 wherein said metal contact includes an enlarged portion on said insulating coating, and a connector extending through encapsulating coating and into engagement with said enlarged portion, said encapsulating coating covering substantially a'l of said contact enlarged portion with the exception of the portion thereof engaged by said connector.

3. A semiconductor device as in claim 1 wherein said encapsulating coating comprises glass, silicon carbide, titanium carbide, germanium nitride, silicon hydroxide, silicon monoxide, or magnesium fluoride.

4. A semiconductor device as in claim 1 wherein said impurity passivating subsance is a doping material distributed throughout said encapsulating coating.

5. A semiconductor device as in claim 4 wherein said encapsulating coating has a thickness less than 10,000 Angstroms over said metal contact, and comprises silicon dioxide.

6. A semiconductor device as in claim 5 wherein said doping material is phosphorus.

7. A semiconductor device as in claim 1 wherein said encapsulating coating has a thickness less than 5,000 Angstroms over said metal contact, and comprises silicon nitride.

8. A semiconductor device as in claim 4 wherein said encapsulating coating has a thickness less than 5,000 Angstroms over said metal contact, and comprises phorphorous doped silicon nitride.

9. A semiconductor device as in calim 4 wherein said encapsulating coating comprises first and second layers, said first layer contains all the doping material in said coating, and said second layer covers said first layer .

10. A semiconductor device as in claim 9 wherein said encapsulating coating has a thickness less than 10,000 Angstroms over said metal contact, and said first and second layers comprise silicon dioxide.

11. A semiconductor device as in claim 9 wherein said encapsulating coating has a thickness less than 5,000 Angstroms over said metal contact, and said first and second layers comprise silicon nitride.

12. A semiconductor device as in claim 2 wherein said encapsulating coating comprises silicon dioxide, and said substance comprises phosphorous.

13. A semiconductor device as in claim 2 wherein said encapsulating coating comprises silicon nitride, and said substance comprises phosphorous.

References Cited

UNITED STATES PATENTS

| | | | |
|---|---|---|---|
| 2,899,344 | 8/1959 | Atalla et al. | 148—1.5 |
| 3,165,430 | 1/1965 | Hugle | 148—187 |
| 3,246,214 | 4/1966 | Hugle | 29—578 X |
| 3,287,243 | 11/1966 | Ligenza | 204—192 |
| 3,295,185 | 1/1967 | Pritchard et al. | 29—589 X |
| 3,334,281 | 8/1967 | Ditrick | 317—235 |
| 3,343,049 | 9/1967 | Miller et al. | 317—234 |
| 3,385,729 | 5/1968 | Larchian | 317—234 X |
| 3,373,051 | 3/1968 | Chu et al. | 317—234 X |
| 3,386,163 | 6/1968 | Brennemann et al. | 29—571 |

OTHER REFERENCES

IBM Technical Disclosure Bulletin, Glass Forming Technique, H. S. Lehman, vol. 8, No. 4, September 1965, pp. 477 and 478.

IBM Technical Disclosure Bulletin, Encapsulation for Semiconductor Devices, H. R. Gates, vol. 8, No. 11, April 1966, p. 1687.

JOHN W. HUCKERT, Primary Examiner

R. F. POLISSACK, Assistant Examiner

U.S. Cl. X.R.

317—235